(12) United States Patent
Moore et al.

(10) Patent No.: US 7,300,485 B1
(45) Date of Patent: Nov. 27, 2007

(54) COOLING FAN FOR ELECTRONIC DEVICES

(76) Inventors: Franklin R. Moore, 1030 E. Columbia Ave. Lot H-52, Battle Creek, MI (US) 49014; Andrew J. Collins, 20701 Two Mile Rd., Battle Creek, MI (US) 49017

( * ) Notice: Subject to any disclaimer, the term of this patent is extended or adjusted under 35 U.S.C. 154(b) by 391 days.

(21) Appl. No.: 10/961,374

(22) Filed: Oct. 12, 2004

(51) Int. Cl.
*B01D 50/00* (2006.01)
*G06F 1/16* (2006.01)

(52) U.S. Cl. .......................... 55/385.6; 55/470; 55/471; 55/472; 55/473; 96/139; 131/233; 131/235.1; 131/242; 454/184; 454/192

(58) Field of Classification Search ............... 55/385.6, 55/472, 470, 471, 473; 96/139; 131/233, 131/235.1, 242; 454/184, 192
See application file for complete search history.

(56) References Cited

U.S. PATENT DOCUMENTS

| | | | |
|---|---|---|---|
| 4,052,179 A * | 10/1977 | Kirk ........................... | 96/139 |
| 6,589,308 B1 * | 7/2003 | Gianelo ..................... | 55/385.6 |
| 6,650,536 B2 | 11/2003 | Lee et al. | |
| 6,654,245 B2 | 11/2003 | Kawashima et al. | |
| 6,657,863 B2 | 12/2003 | Lee et al. | |
| 6,674,640 B2 | 1/2004 | Pokharna et al. | |
| 6,712,582 B1 | 3/2004 | Lin et al. | |
| 6,722,971 B2 | 4/2004 | Gough | |
| 6,750,562 B2 | 6/2004 | Rolls et al. | |
| 6,760,649 B2 | 7/2004 | Cohen | |
| 6,767,379 B2 * | 7/2004 | Jones ......................... | 55/385.6 |
| 6,768,640 B2 | 7/2004 | Doblar et al. | |
| 7,079,387 B2 * | 7/2006 | Brooks et al. .............. | 361/687 |
| 7,092,253 B2 * | 8/2006 | Lam ........................... | 361/690 |
| 2002/0027766 A1 * | 3/2002 | Negishi ...................... | 361/645 |
| 2002/0036886 A1 * | 3/2002 | Negishi ...................... | 361/645 |
| 2006/0068695 A1 * | 3/2006 | Kelley et al. ............... | 454/184 |
| 2006/0199498 A1 * | 9/2006 | Shipley et al. ............. | 454/184 |

* cited by examiner

*Primary Examiner*—Duane Smith
*Assistant Examiner*—Minh-Chau T. Pham

(57) ABSTRACT

An apparatus includes a rigid housing having a plurality of sides removably engaged with the electronic device and a plurality of passageways for effectively channeling air through first and second directions. The apparatus further includes at least one rotary fan moving in a selected radial path situated along one of the sides, a disposable electrostatic filter bifurcating the passageways wherein the contaminants are trapped and a power supply source electrically coupled to the fans.

16 Claims, 3 Drawing Sheets

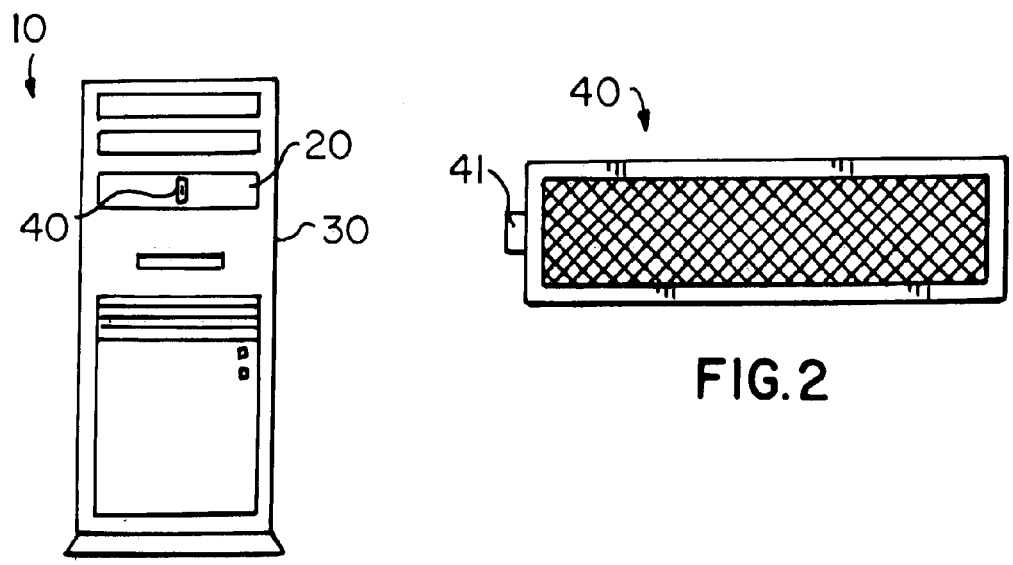
FIG. 2
FIG. 3
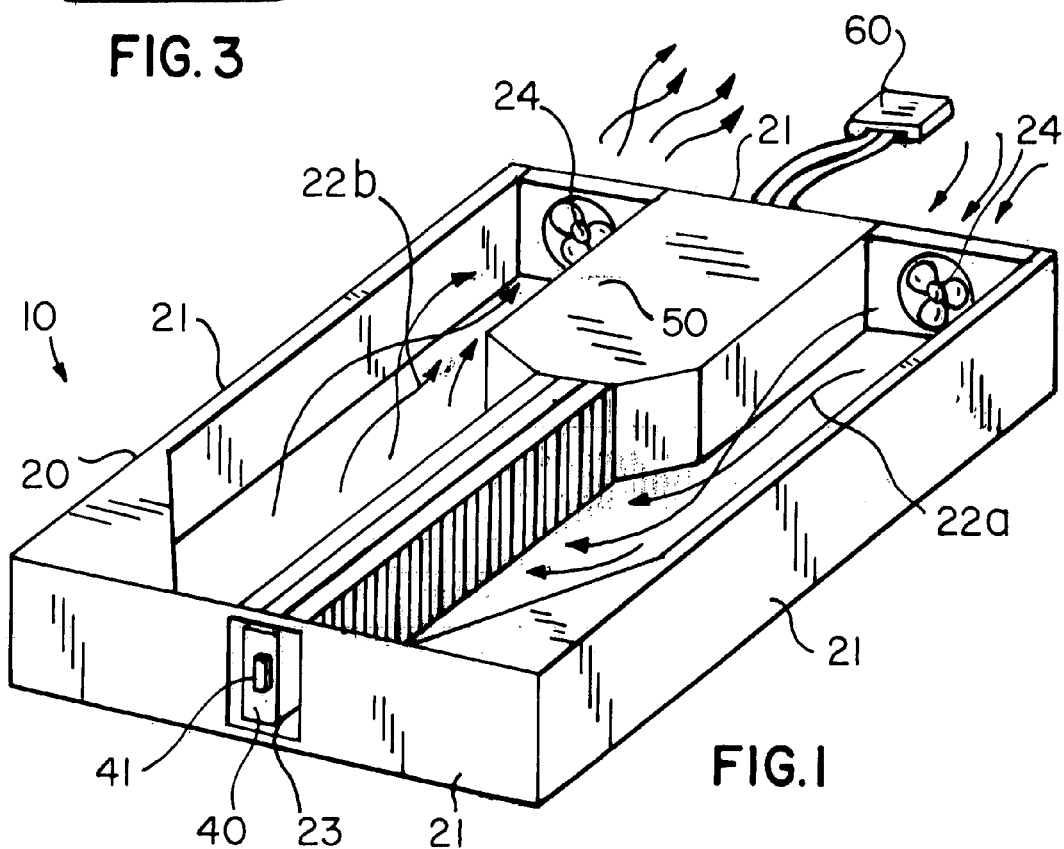
FIG. 1

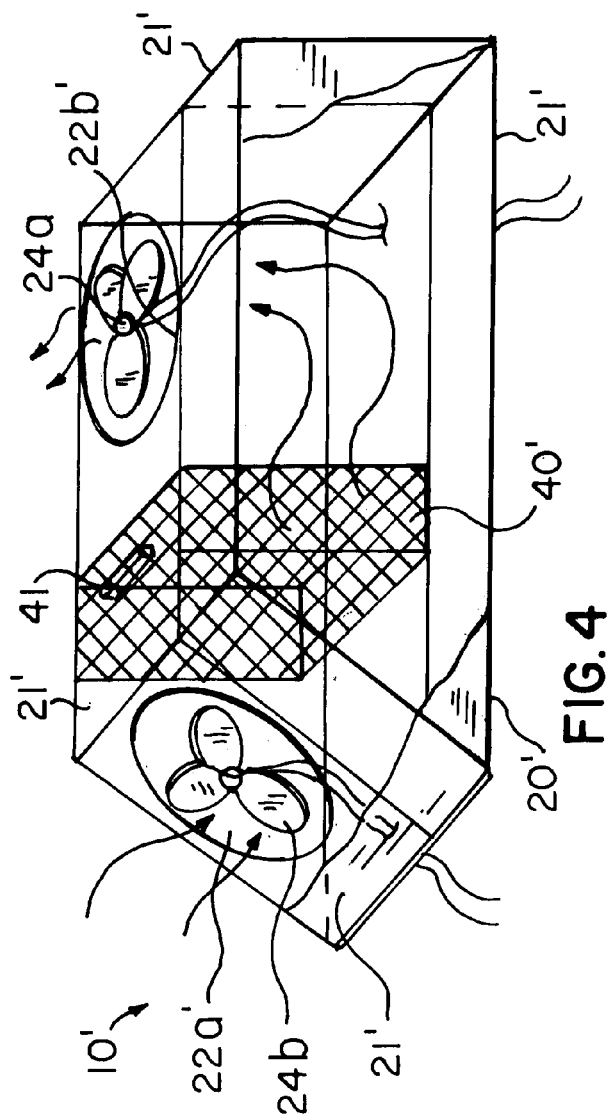
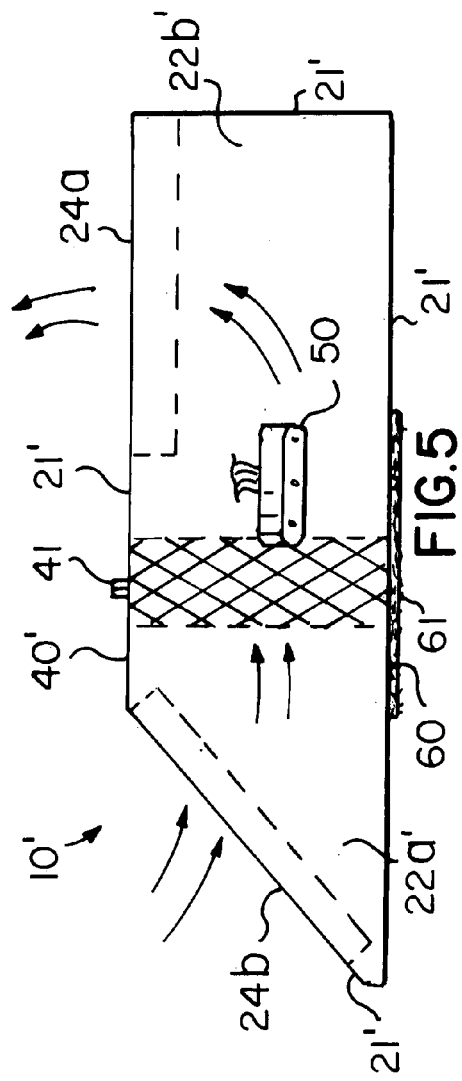
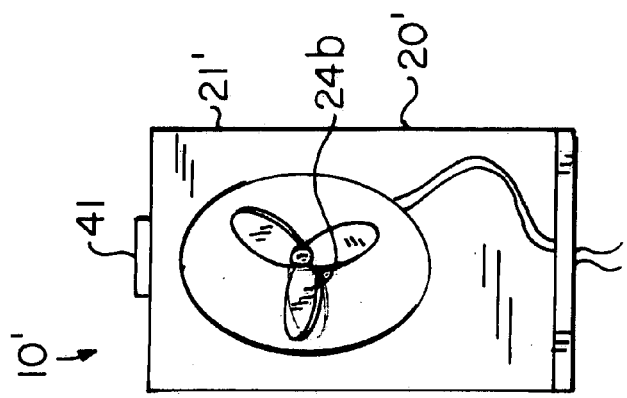

COOLING FAN FOR ELECTRONIC DEVICES

CROSS REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Technical Field

This invention relates to a cooling fan and, more particularly, to a cooling fan for electronic devices.

2. Prior Art

Computer systems are typically available in a range of configurations which may afford a user varying degrees of reliability, availability and serviceability (RAS). In some systems, reliability may be paramount. Thus, a reliable system may include features designed to prevent failures. In other systems, availability may be important and so systems may be designed to have significant fail-over capabilities in the event of a failure. Either of these types of systems may include built-in redundancies of critical components. In addition, systems may be designed with serviceability in mind. Such systems may allow fast system recovery during system failures due to component accessibility. In critical systems, such as high-end servers and some multiple processor and distributed processing systems, a combination of the above features may produce the desired RAS level.

Various drawbacks may be associated with systems that provide high levels of RAS capability. For example, to provide redundancy, additional duplicate system components are usually necessary. Depending on the number of additional components, there may be an increase in overall system size. In some systems, it may be difficult to cool the additional system components and thus additional air plenums may be necessary to provide an adequate flow of cooling air. The additional plenums may also increase system size.

Many systems use a back plane or center plane to distribute the various signals and power to the system circuit boards and components. However, the center plane may complicate system cooling by blocking airflow through the system boards. Further, if the center plane fails, it may not be replaceable without bringing down the system.

In addition, as the size and complexity of a system increases, other components of the system may also be difficult to service. For example, if a component fails, it is sometimes necessary to remove operative components to access the failed component. In such a case, it may be necessary to shut down one or more subsystems, which may mean losing partial or whole system functionality.

Accordingly, a need remains for a cooling fan for electronic devices that overcomes the above-noted shortcomings. The present invention satisfies such a need by providing a fan apparatus that is easy to use, provides adequate cooling for maintaining the integrity of an electronic device and is reasonably priced. Such an apparatus not only provides protection to electrical components of home computers, but can advantageously also be applied to larger scale systems that are used by business and other large companies. The apparatus is conveniently easily replaceable when required, thus ensuring that maintenance is not a hassle and can be performed by anyone.

BRIEF SUMMARY OF THE INVENTION

In view of the foregoing background, it is therefore an object of the present invention to provide a cooling fan for electronic devices. These and other objects, features, and advantages of the invention are provided by an apparatus for trapping contaminants and circulating air within a cavity of an electronic device.

The apparatus includes a rigid housing that has a centrally disposed longitudinal axis and includes a plurality of sides sized and shaped for being removably engageable with the electronic device. Such a housing includes a plurality of passageways oppositely disposed from the axis for effectively channeling air through first and second directions. The housing preferably has a slot formed therein for allowing a user to removably position the filter into the housing. Such a filter includes a tab so that a user can readily and conveniently access the filter during operating conditions.

The apparatus further includes at least one rotary fan moving in a selected radial path and situated along one of the sides for cooperating with the passageways during operating conditions wherein air having a first contamination level is channeled into the housing along the first direction and air having a second contamination level is channeled outwardly and away from the housing along the second direction. One of the fans may be disposed along a horizontal plane extending substantially parallel to the axis wherein another one of the fans is preferably disposed along a selected plane offset at an oblique angle from the axis. Such fan is for channeling air into the housing from an immediately surrounding area.

A disposable electrostatic filter bifurcates the passageways and extends substantially parallel to the axis wherein the contaminants are advantageously trapped upstream of one of the passageways so that the second contamination level is less than the first contamination level. The air having the second contamination level exits the housing for conveniently cooling the electronic device.

A power supply source is electrically coupled to the fans and preferably located internally of the electronic device. The apparatus may further include a mechanism for removably attaching the housing to the electronic device. Such an attaching mechanism includes Velcro affixed to the housing.

BRIEF DESCRIPTION OF THE SEVERAL VIEWS OF THE DRAWING

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawings in which:

FIG. 1 is a perspective view showing a cooling fan for electronic devices, in accordance with the present invention;

FIG. 2 is a front elevational view of the apparatus shown in FIG. 1;

FIG. 3 is an enlarged side elevational view of the filter shown in FIG. 1;

FIG. 4 is a perspective view showing an alternate embodiment of the apparatus shown in FIG. 1, with one of the fans off-set at an oblique angle;

FIG. 5 is a side elevational view of the apparatus shown in FIG. 4;

FIG. 6 is a front elevational view of the apparatus shown in FIG. 4;

DETAILED DESCRIPTION OF THE INVENTION

Figure 8:
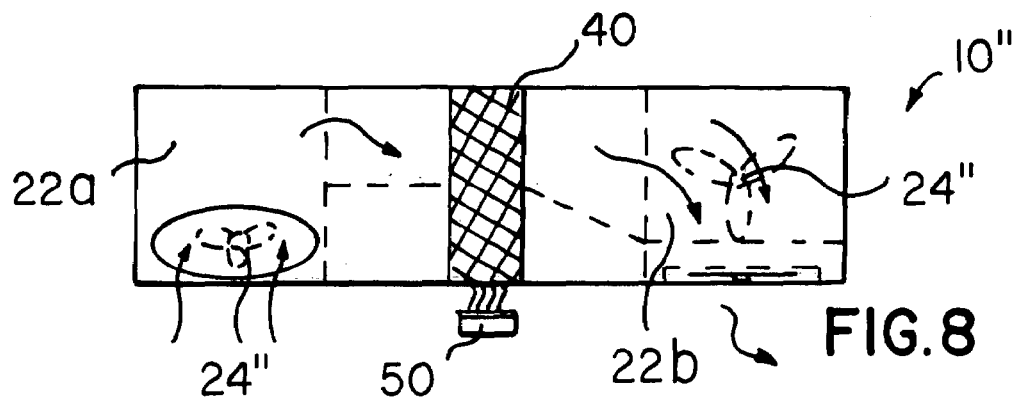
FIG. 8 is a rear elevational view of the apparatus shown in FIG. 7.

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this application will be thorough and complete, and will fully convey the true scope of the invention to those skilled in the art. Like numbers refer to like elements throughout the figures.

The apparatus of this invention is referred to generally in FIGS. 1-3 by the reference numeral 10 and is intended to provide an electronic device cooling fan. It should be understood that the apparatus 10 may be used to cool many different types of electronic and non-electronic devices and should not be limited to only computers.

Referring initially to FIG. 1, the apparatus 10 includes a rigid housing 20 that has a centrally disposed longitudinal axis and includes a plurality of sides 21 sized and shaped for being removably engageable with the electronic device 30. Such a housing 20 includes a plurality of passageways 22 oppositely disposed from the axis for effectively channeling air through first 22a and second 22b directions. The housing 20 has a slot 23 formed therein for allowing a user to removably position the filter 40 (described herein below) into the housing 20. Such a filter 40 includes a tab 41 so that a user can readily and conveniently access the filter 40 during operating conditions.

Referring to FIGS. 1, 4, 6, 7, 8 and 9, the apparatus 10 further includes at least one rotary fan 24 moving in a selected radial path and situated along one of the sides 21 for cooperating with the passageways 22a, b during operating conditions wherein air having a first contamination level is channeled into the housing 20 along the first direction 22a and air having a second contamination level is channeled outwardly and away from the housing 20 along the second direction 22b. In an alternate embodiment 10' one of the fans 24a is disposed along a horizontal plane extending substantially parallel to the axis wherein another one of the fans 24b is disposed along a selected plane offset at an oblique angle from the axis. Such a fan 24b is for assisting in channeling air into the housing 20 from an immediately surrounding area.

Referring to FIGS. 1, 2, 3, 4 and 7, a disposable electrostatic filter 40 bifurcates the passageways 22 and extends substantially parallel to the axis wherein the contaminants are advantageously trapped upstream of one of the passageways 22a so that the second contamination level is less than the first contamination level. The air having the second contamination level exits the housing 20 for conveniently cooling the electronic device 30. Since the air exiting the housing 20 is less contaminated than the air entering the housing it is less harmful to the electronic components of the electronic device 30. This increases the life of the electronic device 30 and improves the cleanliness of the internal components thereof.

Figure 7:
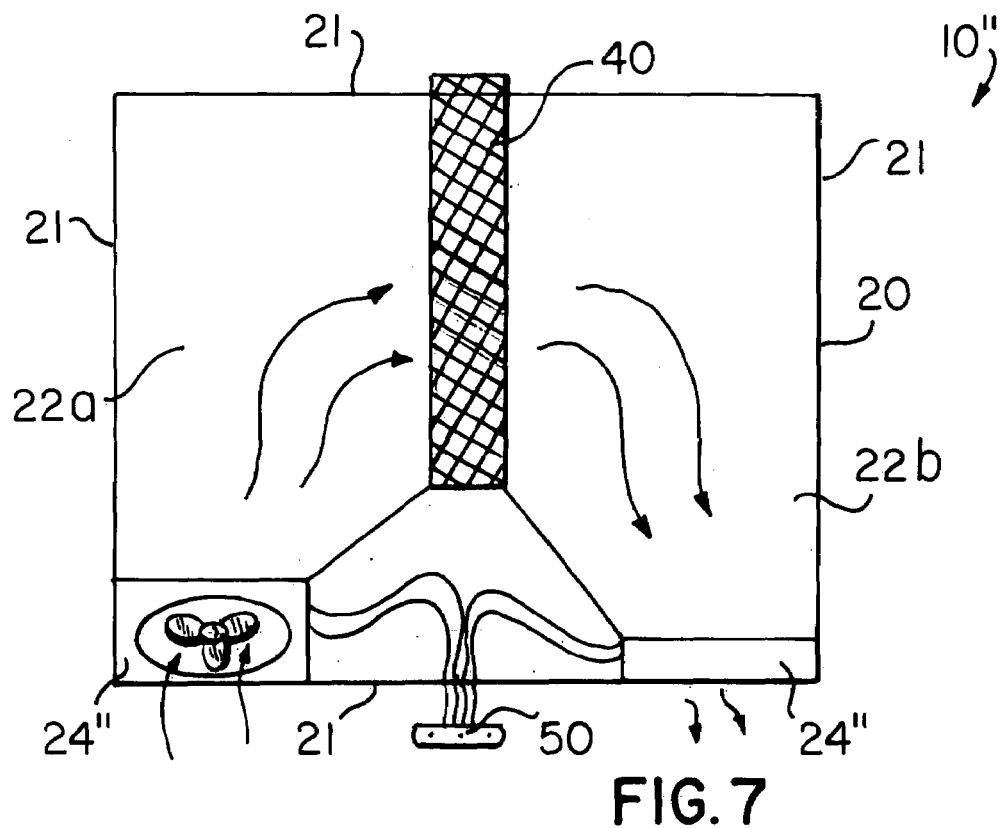
FIG. 7 is a top-plan view showing another embodiment of the apparatus shown in FIG. 1.
Figure 9:
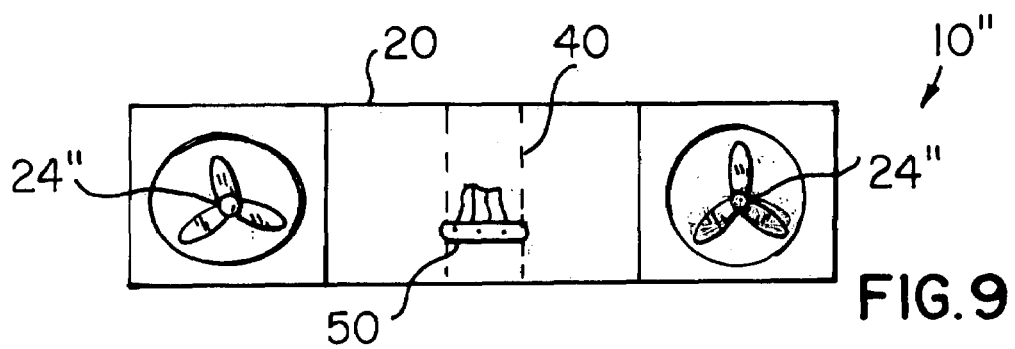
FIG. 9 is a front elevational view of the apparatus shown in FIG. 7.

Referring to FIGS. 1, 5 and 7, a power supply source 50 is electrically coupled to the fans 24 and located internally of the electronic device 30. The apparatus 10 further includes a mechanism 60 for removably attaching the housing 20 to the electronic device 30. In an alternate embodiment 10' such an attaching mechanism 60 includes Velcro 61 affixed to the housing 20. This conveniently allows for easy installation and removal of the housing 20 and quick access to the electrostatic filter 40.

While the invention has been described with respect to a certain specific embodiment, it will be appreciated that many modifications and changes may be made by those skilled in the art without departing from the spirit of the invention. It is intended, therefore, by the appended claims to cover all such modifications and changes as fall within the true spirit and scope of the invention.

In particular, with respect to the above description, it is to be realized that the optimum dimensional relationships for the parts of the present invention may include variations in size, materials, shape, form, function and manner of operation. The assembly and use of the present invention are deemed readily apparent and obvious to one skilled in the art.

What is claimed as new and what is desired to secure by Letters Patent of the United States is:

1. An apparatus for trapping contaminants and circulating air within a cavity of an electronic device, said apparatus comprising:

a housing having a centrally disposed longitudinal axis and including a plurality of sides sized and shaped for being removably engageable with the electronic device, said housing comprising a plurality of passageways oppositely disposed from the axis for channeling air through first and second directions;

at least one fan situated along one said sides for cooperating with said passageways during operating conditions wherein air having a first contamination level is channeled into said housing along the first direction and air having a second contamination level is channeled outwardly and away from said housing along the second direction;

a filter bifurcating said passageways and extending substantially parallel to the axis wherein the contaminants are trapped upstream one said passageways and so that the second contamination level is less than the first contamination level, said air having the second contamination level exiting said housing for cooling the electronic device; and a power supply source electrically coupled to said fans.

2. The apparatus of claim 1, wherein said power supply source is located internally of said electronic device.

3. The apparatus of claim 1, further comprising: means for removably attaching said housing to the electronic device, said attaching means including Velcro affixed to said housing.

4. The apparatus of claim 1, wherein said housing has a slot formed therein for allowing a user to removably position said filter into said housing, said filter comprising a tab so that a user can readily access said filter during operating conditions.

5. The apparatus of claim 1, wherein one said fans is disposed along a horizontal plane extending substantially parallel to the axis.

6. The apparatus of claim 1, wherein another said fans is disposed along a selected plane offset at an oblique angle from the axis, said another fan for assisting to channel air into said housing from an immediate surrounding area.

7. An apparatus for trapping contaminants and circulating air within a cavity of an electronic device, said apparatus comprising:
   a rigid housing having a centrally disposed longitudinal axis and including a plurality of sides sized and shaped for being removably engaged with the electronic device, said housing comprising a plurality of passageways oppositely disposed from the axis for channeling air through first and second directions;
   at least one rotary fan situated along one said sides for cooperating with said passageways during operating conditions wherein air having a first contamination level is channeled into said housing along the first direction and air having a second contamination level is channeled outwardly and away from said housing along the second direction;
   a disposable filter bifurcating said passageways and extending substantially parallel to the axis wherein the contaminants are trapped upstream one said passageways and so that the second contamination level is less than the first contamination level, said air having the second contamination level exiting said housing for cooling the electronic device; and
   a power supply source electrically coupled to said fans.

8. The apparatus of claim 7, wherein said power supply source is located internally of said electronic device.

9. The apparatus of claim 7, further comprising: means for removably attaching said housing to the electronic device, said attaching means including Velcro affixed to said housing.

10. The apparatus of claim 7, wherein said housing has a slot formed therein for allowing a user to removably position said filter into said housing, said filter comprising a tab so that a user can readily access said filter during operating conditions.

11. The apparatus of claim 7, wherein one said fans is disposed along a horizontal plane extending substantially parallel to the axis.

12. The apparatus of claim 7, wherein another said fans is disposed along a selected plane offset at an oblique angle from the axis, said another fan for assisting to channel air Into said housing from an immediate surrounding area.

13. An apparatus for trapping contaminants and circulating air within a cavity of an electronic device, said apparatus comprising:
   a rigid housing having a centrally disposed longitudinal axis and including a plurality of sides sized and shaped for being removably engaged with the electronic device, said housing comprising a plurality of passageways oppositely disposed from the axis for channeling air through first and second directions;
   first and second rotary fans moving in a selected radial path and situated along one said sides for cooperating with said passageways during operating conditions wherein air having a first contamination level is channeled into said housing along the first direction and air having a second contamination level is channeled outwardly and away from said housing along the second direction;
   a disposable electrostatic filter bifurcating said passageways and extending substantially parallel to the axis wherein the contaminants are trapped upstream one said passageways and so that the second contamination level is less than the first contamination level, said air having the second contamination level exiting said housing for cooling the electronic device; and
   a power supply source electrically coupled to said fans;
   wherein said filter has a longitudinal length registered parallel to the longitudinal axis of said housing, said filter being equidistantly spaced from said first and second fans, said first and second rotary fans rotating in opposite directions for channeling air into said housing and out from said housing respectively;
   wherein said first and second passageways are coextensively shaped and extend along an entire longitudinal length of said housing, said first passageway being in direct communication with said first rotary fan and isolated from said second rotary fan, said second passageway being in direct communication with said second rotary fan and isolated from said first rotary fan.

14. The apparatus of claim 13, wherein said power supply source is located internally of said electronic device.

15. The apparatus of claim 13, further comprising: means for removably attaching said housing to the electronic device, said attaching means including Velcro affixed to said housing.

16. The apparatus of claim 13, wherein said housing has a slot formed therein for allowing a user to removably position said filter into said housing, said filter comprising a tab so that a user can readily access said filter during operating conditions.

* * * * *